(12) United States Patent
Miyamoto

(10) Patent No.: US 6,514,348 B2
(45) Date of Patent: Feb. 4, 2003

(54) SUBSTRATE PROCESSING APPARATUS

(75) Inventor: Matsutaro Miyamoto, Tokyo (JP)

(73) Assignee: Ebara Corporation, Tokyo (JP)

( * ) Notice: Subject to any disclaimer, the term of this patent is extended or adjusted under 35 U.S.C. 154(b) by 0 days.

(21) Appl. No.: 09/902,766

(22) Filed: Jul. 12, 2001

(65) Prior Publication Data
US 2002/0005167 A1 Jan. 17, 2002

(30) Foreign Application Priority Data
Jul. 13, 2000 (JP) ........................................ 2000-212767

(51) Int. Cl.[7] ............................ C23C 16/00; C23F 1/00; F04B 37/14
(52) U.S. Cl. .................... 118/715; 118/50; 156/345.29; 156/345.33; 156/345.34; 417/423.4
(58) Field of Search .............. 118/715, 50; 156/345.29, 156/345.33, 345.34; 417/423.4

(56) References Cited

U.S. PATENT DOCUMENTS 4,873,833 A * 10/1989 Pfeiffer et al. .............. 417/901
6,327,863 B1 * 12/2001 Yamartino et al. .......... 417/901
2002/0005167 A1 * 1/2002 Miyamoto ................... 118/715
2002/0117112 A1 * 8/2002 Okabe et al. ................ 118/715
2002/0122885 A1 * 9/2002 Ahn ........................ 427/255.28

* cited by examiner

Primary Examiner—Jeffrie R. Lund
(74) Attorney, Agent, or Firm—Armstrong, Westerman & Hattori, LLP

(57) ABSTRACT

A substrate processing apparatus processes a substrate introduced into a chamber under a low pressure. The substrate processing apparatus comprises a vacuum pump for evacuating a chamber and a gas ejection portion provided in the vacuum pump for ejecting a gas toward the substrate. The vacuum pump is disposed in the vicinity of or inside of the chamber. The substrate processing apparatus further comprises a gas introduction path passed through at least a portion of a rotor in the vacuum pump for introducing the gas into the gas ejection portion. The gas ejection portion in the vacuum pump comprises a valve body for closing and opening a suction port provided on a chamber side of the vacuum pump. The vacuum pump has a moving mechanism for vertically moving the valve body.

8 Claims, 5 Drawing Sheets

SUBSTRATE PROCESSING APPARATUS

BACKGROUND OF THE INVENTION

1. Field of the Invention

The present invention relates to a substrate processing apparatus for processing a substrate such as a semiconductor substrate, and more particularly to a substrate processing apparatus for processing a semiconductor substrate for formation of a thin film, polishing, or the like in a chamber evacuated by a vacuum pump.

2. Description of the Related Art

Generally, when a substrate is processed at a pressure lower than the atmospheric pressure (hereinafter referred to as "vacuum"), the substrate is introduced into a vacuum chamber evacuated by a vacuum pump, and a process, such as formation of a thin film, plating, or polishing, is then carried out in the vacuum chamber. Various methods are known for forming a thin film on the surface of a substrate. These methods include physical vapor deposition (PVD) such as sputtering and ion plating, and chemical vapor deposition (CVD) utilizing vacuum evaporation or thermal reaction or plasma excitation under a low pressure. In addition to the thin film deposition, various other methods of processing a substrate at a low pressure, such as surface processing with dry etching, pattern exposure, resist processing, cleaning, drying, annealing, ion implantation, inspection, and measurement.

FIG. 5 is a schematic view showing an example of the whole structure of a conventional substrate processing apparatus, which is a film deposition apparatus for forming a thin film of a high dielectric material or a ferroelectric material, such as barium titanate, strontium titanate, or the like, through the CVD process. As shown in FIG. 5, in this substrate processing apparatus (film deposition apparatus), a hermetically sealed vacuum chamber (deposition chamber) 110 is provided downstream of a vaporizer (a gas generator) 100 for vaporizing a liquid raw material. A shutoff valve 112 and a conductance valve 113 are disposed downstream of a suction port 111 provided in the deposition chamber 110. Further, a turbo-molecular pump 120 and a roughing vacuum pump 120a as vacuum pumps are disposed downstream of the conductance valve 113. A substrate holding section (susceptor) 114 for holding a substrate W is provided in the deposition chamber 110. A gas ejection head (shower head) 115 as a gas ejection portion for ejecting a deposition gas toward the substrate W is provided on the upper portion of the deposition chamber 110. An oxidizing gas pipe 130 for supplying an oxidizing gas such as oxygen is connected to the deposition chamber 110.

In such a substrate processing apparatus, a substrate W to be processed is placed on the substrate holding section 114 with the use of a robot hand or the like, and the deposition chamber 110 is evacuated by the vacuum pumps 120, 120a. Then, a lifting/lowering mechanism (not shown) connected to the substrate holding section 114 is driven to lift the substrate holding section 114 to a position for film deposition. A raw material gas mixed with an oxidizing gas is ejected from nozzle holes formed in the gas ejection head 115 toward the substrate W while the substrate W is kept at a predetermined temperature by a temperature adjustment mechanism (not shown). The ejected gases of the raw material gas and the reactive gas are reacted with each other on the surface of the substrate W to form a film thereon. The reacted gas is discharged through the suction port 111 by the vacuum pumps 120, 120a. In some cases, the film deposition is performed while the substrate W on the substrate holding section 114 is being rotated by a rotation mechanism (not shown).

The pressure in the deposition chamber 110 is controlled by adjusting the degree of opening of the shutoff valve 112 and the conductance valve 113 connected to the suction port 111, and by adjusting the amount of gas ejected from the gas ejection head 115. When one of the vacuum pumps 120, 120a is replaced with new one, the shutoff valve 112 is closed to keep the interior of the deposition chamber 110 under vacuum. On the other hand, when a plurality of vacuum pumps 120, 120a are disposed in the system, a shutoff valve disposed upstream of a vacuum pump that is not operated is closed.

In order to efficiently process the substrate, it is necessary to optimize the positional relationship between the substrate and the components in the apparatus or between the substrate and a vacuum pump (vacuum evacuation section). Particularly, this positional relationship should preferably be designed such that the gas introduced from the gas ejection portion is evenly ejected onto the whole surface of the substrate.

Further, in order to improve productivity of processing a substrate and to increase the substrate processing level (fineness), it is necessary to improve the responsiveness in the pressure control in the case where the pressure in the chamber is controlled from an initial pressure to a predetermined pressure. Specifically, it is necessary to dispose the gas ejection portion at a proper position relative to the surface of the substrate for speedily introducing and discharging the gas and improving the controllability of the pressure around the surface of the substrate.

Further, the vacuum pump (vacuum evacuation section) such as a turbo-molecular pump, the shutoff valve and the conductance valve for adjusting the pressure in the chamber, the gas ejection portion, and the like are provided in the conventional substrate processing apparatus, independently of each other. Therefore, spaces for each of these components are required, thereby increasing the size of the apparatus and the vacuum chamber.

SUMMARY OF THE INVENTION

The present invention has been made in view of the above drawbacks. It is therefore an object of the present invention to provide a substrate processing apparatus which can optimize a positional relationship between a substrate to be processed and a gas ejection portion or between the substrate and a vacuum evacuation section to improve the responsiveness in a pressure control around the surface of the substrate, and can be downsized.

In order to attain the above object, according to an aspect of the present invention, there is provided a substrate processing apparatus for processing a substrate introduced into a chamber under a low pressure, the substrate processing apparatus comprising: a vacuum pump for evacuating the chamber, the vacuum pump being disposed in the vicinity of the chamber; and a gas ejection portion provided in the vacuum pump for ejecting a gas toward the substrate.

According to another aspect of the present invention, there is provided a substrate processing apparatus for processing a substrate introduced into a chamber under a low pressure, the substrate processing apparatus comprising: a vacuum pump for evacuating the chamber, the vacuum pump being disposed inside of the chamber; and a gas ejection portion provided in the vacuum pump for ejecting a gas toward the substrate.

With this structure, a vacuum pump for evacuating the chamber is provided integrally with a gas ejection portion for ejecting a gas toward the substrate. Accordingly, both of evacuation of a gas from the surface of the substrate and ejection of a gas onto the surface of the substrate can directly be performed, so that the pressure around the surface of the substrate can speedily be adjusted. Therefore, the productivity and quality of processing a substrate can be improved.

When the gas ejection portion in the vacuum pump is provided on a suction side of the vacuum pump, the gas can efficiently be introduced into the chamber while the exhaust capacity of the vacuum pump is sufficiently maintained. Particularly, in the case of a turbo-molecular pump having a rotating exhaust section and a stationary exhaust section which are concentrically provided, no exhaust capacity can be obtained on a rotating shaft of a rotor, i.e., at positions inside of the inner circumferential portion of rotary vanes. Therefore, when the gas ejection portion and a path necessary for the gas ejection portion are provided along the axial direction of the rotating shaft, the gas can efficiently be introduced into the chamber without lowering the exhaust capacity of the pump. Further, since the suction port of the vacuum pump has a less complicate structure than the interior of the vacuum pump, it is easy to provide the gas ejection portion and the path necessary for the gas ejection portion, on the suction port.

According to a preferred aspect of the present invention, the substrate processing apparatus further comprises a gas introduction path passed through at least a portion of a rotor in the vacuum pump for introducing the gas into the gas ejection portion. When the gas introduction path is formed in (a rotating shaft of) the rotor, the gas can be introduced without lowering the exhaust capacity of the pump, and a gas inlet port can be provided at a position opposite to the suction port. This can eliminate the need to provide the gas introduction path and the gas inlet port in the horizontal direction (radial direction) of the vacuum pump. Therefore, a space for installation of the apparatus can be reduced, and the operation of the apparatus can be simplified.

Particularly, when the gas introduction path is linearly formed along the axial direction of the rotating shaft of the rotor, factors of deterioration in the control responsiveness, such as a bend of the gas introduction path, can be eliminated to improve the responsiveness in the pressure control. Consequently, the pressure in the chamber can be controlled without using the shutoff valve or the conductance valve by simply adjusting the amount of gas introduced.

According to another preferred aspect of the present invention, the gas ejection portion in the vacuum pump comprises a valve body for closing and opening a suction port provided on a chamber side of the vacuum pump; and the vacuum pump has a moving mechanism for vertically moving the valve body. Specifically, the vacuum pump also serves as a valve.

With this structure, the pressure in the chamber can efficiently and speedily be controlled by not only adjusting the amount of gas introduced from the gas ejection portion, but also adjusting the degree of opening of the valve body.

As described above, when the gas ejection portion and the gas introduction path are provided in the vacuum pump, a deposition gas can be ejected at an optimal position toward the substrate. Further, contradictory effects, i.e., evacuation of a gas from the surface of the substrate and ejection of a gas onto the surface of the substrate, can simultaneously be obtained.

The above and other objects, features, and advantages of the present invention will be apparent from the following description when taken in conjunction with the accompanying drawings which illustrates preferred embodiments of the present invention by way of example.

DETAILED DESCRIPTION OF THE PREFERRED EMBODIMENTS

A substrate processing apparatus according to a first embodiment of the present invention will be described below with reference to FIGS. 1 and 2. A film deposition apparatus with the CVD process will be described as an example of the substrate processing apparatus. The present invention, however, is not limited to the film deposition apparatus, and can be applied to various types of substrate processing apparatus.

Figure 1:
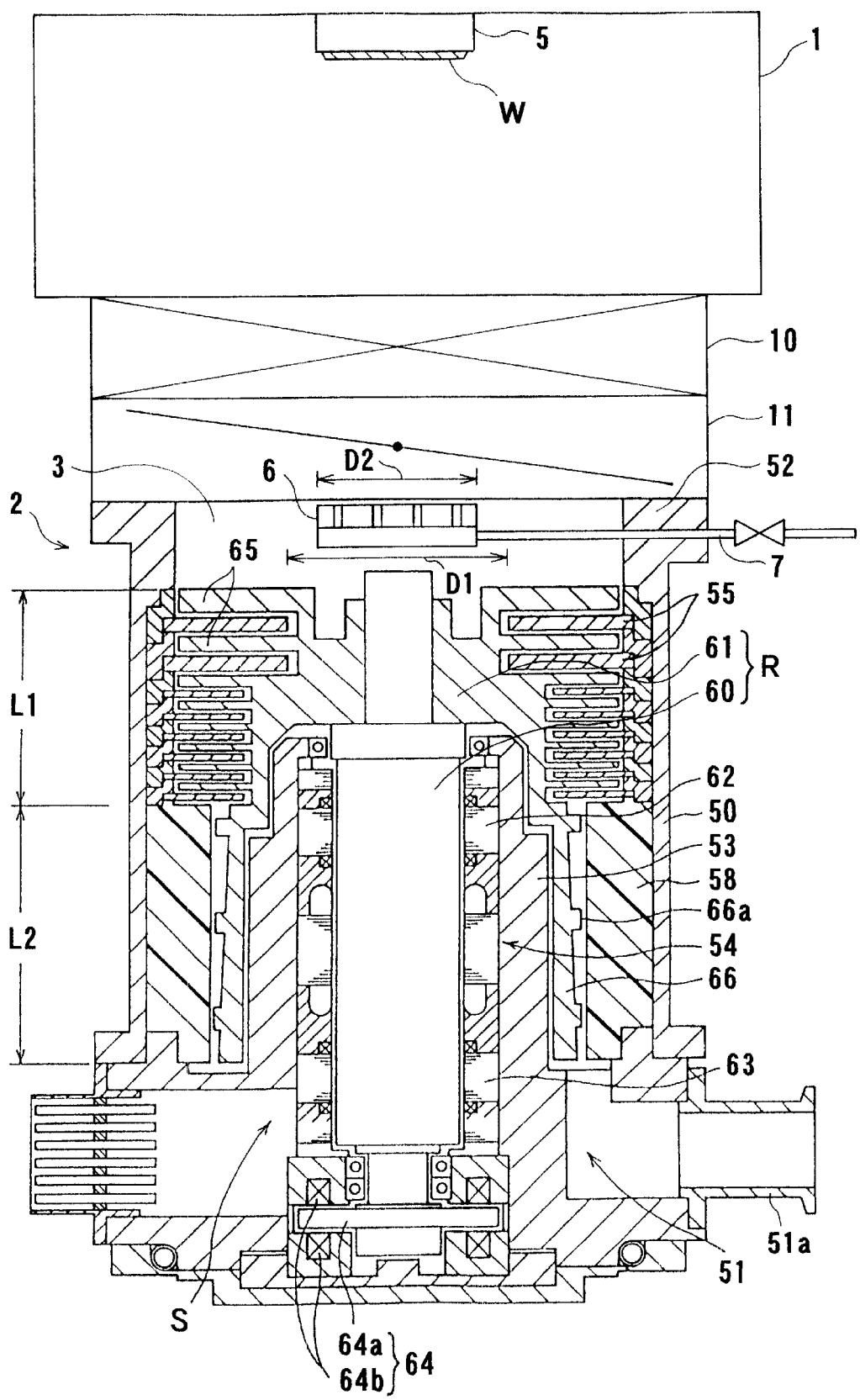
FIG. 1 is a vertical cross-sectional view showing the whole structure of a substrate processing apparatus according to a first embodiment of the present invention.

FIG. 1 is a vertical cross-sectional view showing the whole structure of a substrate processing apparatus according to the first embodiment of the present invention. FIG. 1 shows only a deposition chamber and portions disposed downstream of the deposition chamber in the substrate processing apparatus, and portions other than a vacuum pump are schematically shown for simplification.

As shown in FIG. 1, a shutoff valve 10 for keeping the interior of a deposition chamber 1 under vacuum and a conductance valve 11 for pressure control are connected to the downstream side of the deposition chamber (vacuum chamber) 1. A turbo-molecular pump 2 as a vacuum pump is disposed adjacent to these valves 10, 11. The deposition chamber 1 can be evacuated by the vacuum pump 2. In the present embodiment, a turbo-molecular pump is used as the vacuum pump. However, the vacuum pump is not limited to the turbo-molecular pump, and the present invention can be applied to any vacuum pump.

As shown in FIG. 1, a substrate holding section 5 for holding a substrate W to be processed in such a state that the substrate W faces downwardly is provided on the upper portion of the deposition chamber 1. The substrate W is introduced into the deposition chamber 1 with the use of a robot hand (not shown) and is held on the substrate holding section 5.

As shown in FIG. 1, the turbo-molecular pump (hereinafter referred to as simply "pump" in some cases) 2 has a cylindrical pump casing 50 housing a rotor (rotating portion) R and a stator (a stationary portion) S to form an exhaust vane section L1 and a groove exhaust section L2. The lower portion of the pump casing 50 is covered with a base member 51 having an exhaust port 51a. A flange 52 connected to the conductance valve 11 is provided on the upper portion of the pump casing 50. An opening, which serves as a suction port 3, is formed in the upper portion of the flange 52. The stator S mainly comprises a stationary cylindrical section 53 vertically extended at the center of the base member 51, and stationary sections in the exhaust vane section L1 and the groove exhaust section L2.

The rotor R comprises a main shaft 60 disposed inside of the stationary cylindrical section 53 and a rotating cylindrical section 61 attached to the main shaft 60. A drive motor 54 is provided between the main shaft 60 and the stationary cylindrical section 53. An upper radial bearing 62 is provided above the drive motor 54, and a lower radial bearing 63 is provided below the drive motor 54. An axial bearing 64 is disposed at the lower portion of the main shaft 60. The axial bearing 64 comprises a target disk 64a mounted on the lower end of the main shaft 60, and upper and lower electromagnets 64b provided on the stator S. With this structure, the rotor R can be rotated at a high speed under five-axial active control.

Rotary vanes 65 are integrally provided on the upper periphery of the rotating cylindrical section 61 to constitute an impeller. Stationary vanes 55 are disposed alternately with the rotary vanes 65 on the inner circumferential surface of the pump casing 50. The rotary vanes 65 and the stationary vanes 55 constitute the exhaust vane section L1 for performing evacuation action through interaction between the rotary vane 65 rotated at a high speed and the stationary vane 55.

Further, the groove exhaust section L2 is provided at the downstream side of the exhaust vane section L1. Specifically, the rotating cylindrical section 61 has a screw groove section 66 with screw ridges 66a formed on the outer surface thereof so that the stationary cylindrical section 53 is surrounded by the screw groove section 66. The stator S has a screw groove section spacer 58 surrounding the outer circumferential surface of the screw groove section 66. The groove exhaust section L2 performs evacuation action through the drag effect produced by the screw ridges 66a of the screw groove section 66 rotated at a high speed.

As described above, the groove exhaust section L2 is provided at the downstream side of the exhaust vane section L1. Accordingly, this turbo-molecular pump can cope with a wide range of flow rate.

A gas ejection portion (shower head) 6 for ejecting a deposition gas toward the substrate W held on the substrate holding section 5 is provided in the suction port 3 of the turbo-molecular pump 2 so as to face the substrate holding section 5 provided on the upper portion of the deposition chamber 1. A gas introduction path 7 is passed through the flange 52 in the turbo-molecular pump 2 and is connected to the gas ejection portion 6. A deposition gas supplied through the gas introduction path 7 is ejected from the gas ejection portion 6 toward the substrate W held on the substrate holding section 5 to perform film deposition on the substrate W.

Figure 2:
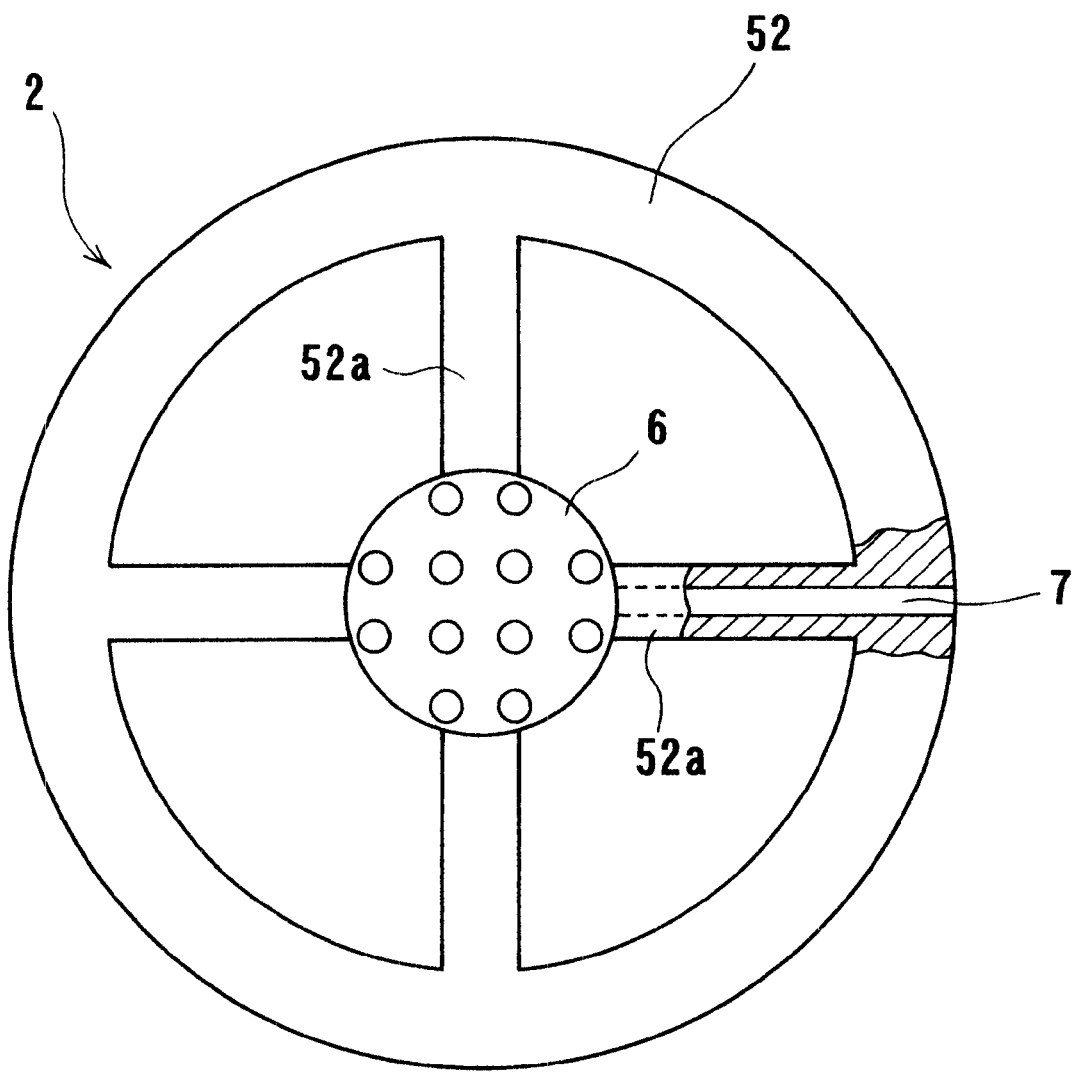
FIG. 2 is a top view of a turbo-molecular pump shown in FIG. 1.

FIG. 2 is a partially cutaway top view of the turbo-molecular pump 2 shown in FIG. 1. As shown in FIG. 2, the gas ejection portion 6 is supported by four support members 52a extended radially inwardly from the flange 52 in the turbo-molecular pump 2. The gas introduction path 7 is formed inside of one of the support members 52a.

Further, as shown in FIG. 1, the outer diameter D2 of the gas ejection portion 6 is smaller than the inner diameter D1 of the rotary vane 65 so as not to lower the exhaust capacity of the turbo-molecular pump 2, that is, so that the suction portion of the turbo-molecular pump 2 is not covered with the gas ejection portion 6.

In this embodiment, the pressure in the deposition chamber 1 is controlled by adjusting the degree of opening of the shutoff valve 10 and the conductance valve 11 connected to the suction port 3, and by adjusting the amount of gas ejected from the gas ejection portion 6. If the pressure in the deposition chamber 1 can be controlled by only the exhaust capacity of the pump 2 and the amount of gas introduced, then one of or both of the shutoff valve 10 and the conductance valve 11 may be omitted. Further, in FIG. 1, the pump 2 is installed outside of the vacuum chamber (deposition chamber) 1. However, the pump 2 may be disposed inside of the vacuum chamber 1 so that the suction port 3 in the pump 2 is brought closer to the surface of the substrate W held on the substrate holding section 5, for example.

Thus, the vacuum pump (turbo-molecular pump) 2 for evacuating the vacuum chamber 1 is provided integrally with the gas ejection portion 6 for ejecting a deposition gas toward the substrate W. Accordingly, both of evacuation of a gas from the surface of the substrate W and ejection of a gas onto the surface of the substrate W can directly be performed, so that the pressure around the surface of the substrate W can speedily be adjusted. Therefore, the productivity and quality of processing the substrate can be improved.

Figure 3:
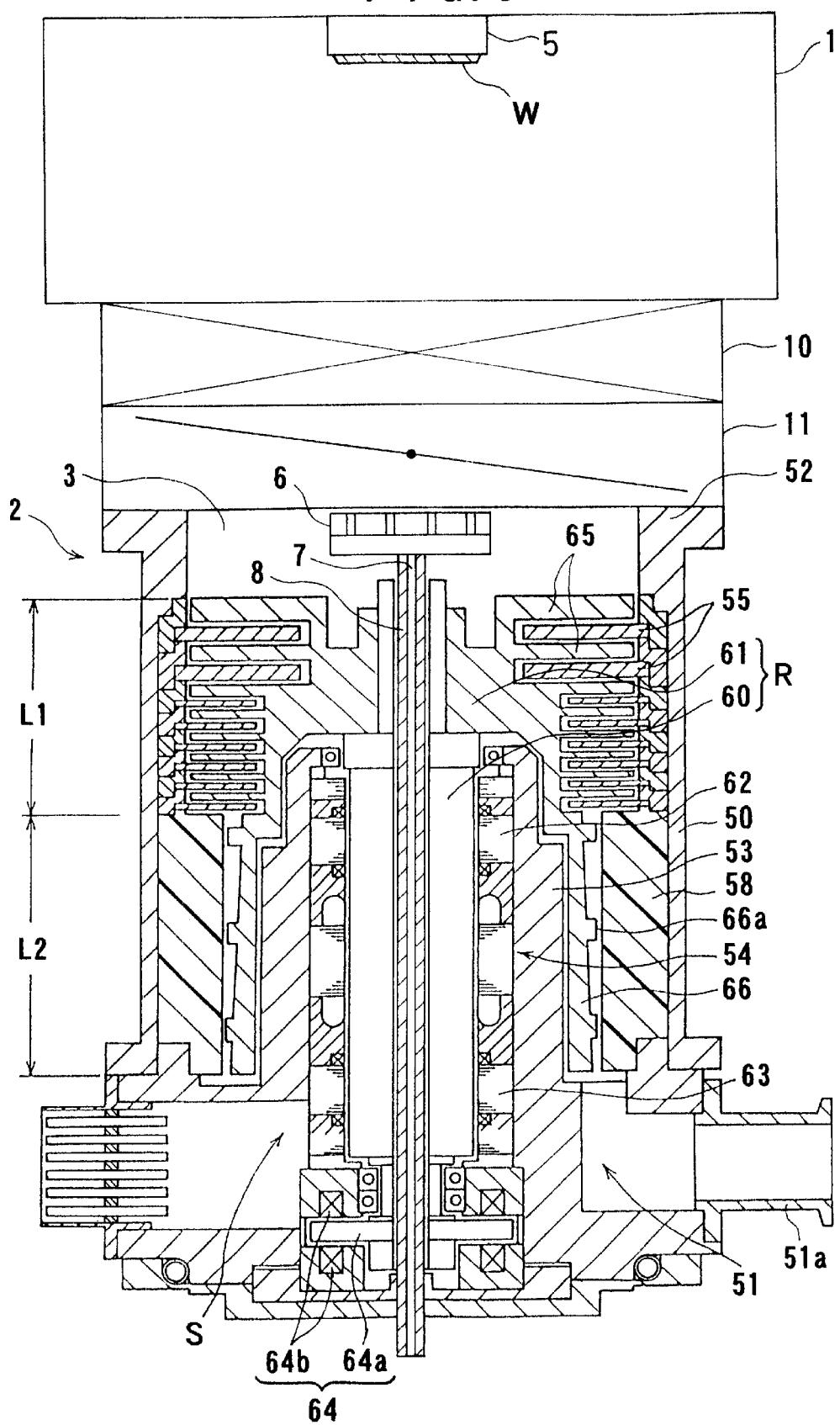
FIG. 3 is a vertical cross-sectional view showing the whole structure of a substrate processing apparatus according to a second embodiment of the present invention.

A substrate processing apparatus according to a second embodiment of the present invention will be described below with reference to FIG. 3. FIG. 3 is a vertical cross-sectional view showing the whole structure of a substrate processing apparatus according to the second embodiment of the present invention. In FIG. 3, like parts and components are designated by the same reference numerals and characters as those shown in FIG. 1. FIG. 3 shows only a deposition chamber and portions disposed downstream of the deposition chamber in the substrate processing apparatus, and portions other than a vacuum pump are schematically shown for simplification.

As shown in FIG. 3, the main shaft 60 is hollow in the present embodiment. A gas introduction pipe 8 having a gas introduction path 7 therein is passed through the inner circumferential portion of the hollow shaft 60. Specifically, the gas introduction path 7 is formed so as to vertically pass through the main shaft 60 of the pump 2. This gas introduction path 7 is extended so as to be passed through the bottom of the stator S and is connected to a gas generator (not shown). The other structure is the same as the structure of the first embodiment described above, and will not be described below.

The gas introduction pipe 8 and the gas ejection portion 6 are not rotated according to the high-speed rotation of the rotor R. In order to prevent the exhaust gas from flowing back from the exhaust side to the suction side, screw ridges may be formed on one of or both of the outer circumferential surface of the gas introduction pipe 8 and the inner circumferential surface of the hollow shaft 60.

Thus, the gas introduction path 7 is provided so as to be passed through the main shaft 60 of the pump 2. Accordingly, a mechanism for supplying a gas to the gas ejection portion 6 can be provided on the lower portion of the pump 2. Therefore, the space for installation of the substrate processing apparatus can be reduced in the horizontal direction. Further, a s shown in FIG. 3, the gas introduction path 7 can be linear for thereby further improving the responsiveness in the pressure control.

Figure 4:
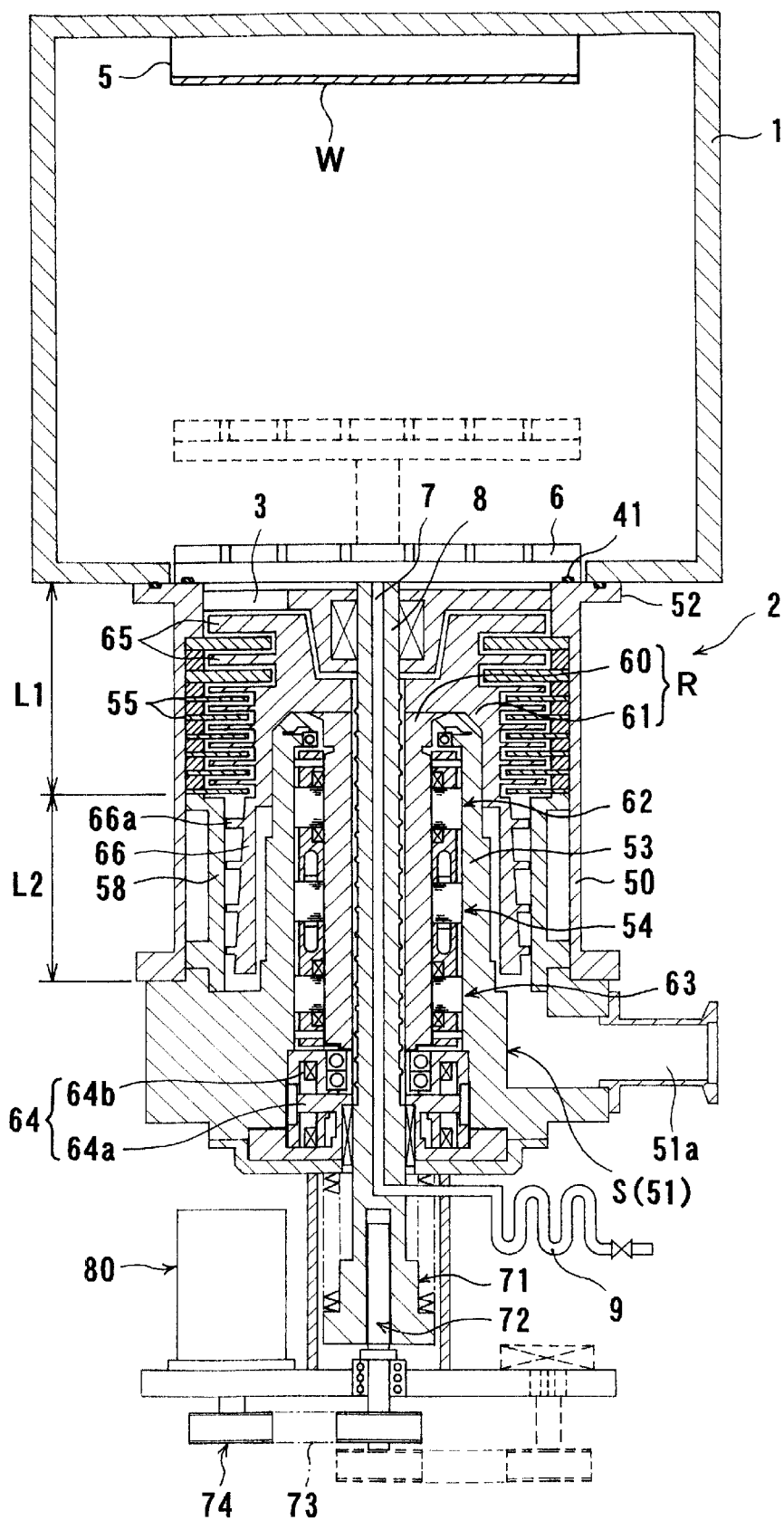
FIG. 4 is a vertical cross-sectional view showing the whole structure of a substrate processing apparatus according to a third embodiment of the present invention.
Figure 5:
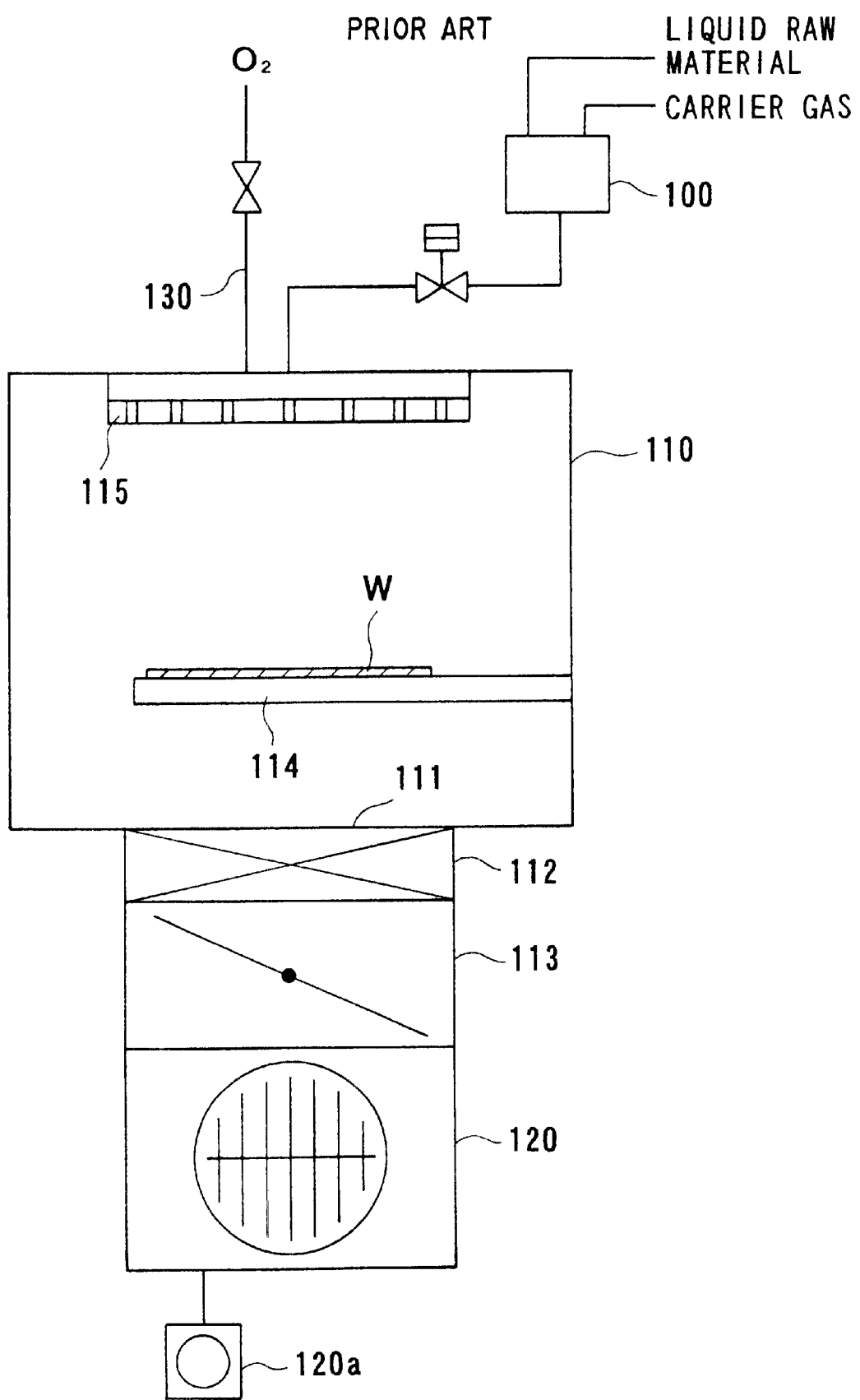
FIG. 5 is a schematic view showing the whole structure of a conventional substrate processing apparatus.

A substrate processing apparatus according to a third embodiment of the present invention will be described below with reference to FIG. 4. FIG. 4 is a vertical cross-sectional view showing the whole structure of a substrate processing apparatus according to the third embodiment of the present invention. In FIG. 4, like parts and components are designated by the same reference numerals and characters as those shown in FIG. 3. FIG. 4 shows only a deposition chamber and portions disposed downstream of the deposition chamber in the substrate processing apparatus, and portions other than a vacuum pump are schematically shown for simplification.

In this embodiment, a gas introduction pipe 8 having a gas introduction path 7 therein is passed through the inner circumferential portion of the hollow shaft 60, as with the second embodiment. This gas introduction path 7 is connected to a gas ejection portion 6 disposed above a suction port 3 in the pump. Neither the shutoff valve nor the conductance valve used in the second embodiment is provided in the third embodiment. Instead, in the third embodiment, the gas ejection portion 6 is provided as a disk-shaped valve body for closing and opening the suction port 3 of the pump 2.

The gas introduction pipe 8 and the gas ejection portion 6 connected thereto can be lifted and lowered by a lifting/lowering mechanism (moving mechanism), which will be described later. When the gas ejection portion 6 is lifted or lowered by the lifting/lowering mechanism, the gas ejection portion 6 as the valve body closes or opens the suction port 3 of the pump. As shown in FIG. 4, the gas introduction path 7 formed inside of the gas introduction pipe 8 is connected to the exterior through a flexible tube 9. Accordingly, the gas introduction path 7 is suitable for vertical movement of the gas introduction pipe 8.

A nut 71 having a ball screw mechanism is mounted on the lower end of the gas introduction pipe 8, and an external thread 72 is screwed to the nut 71. The external thread 72 is connected to a belt 73 and a pulley 74 and is rotated in a predetermined direction by the drive of a motor 80 mounted on the pulley 74. When the external thread 72 is rotated through the pulley 74 and the belt 73 by the drive of the motor 80, the nut 71 and the gas introduction pipe 8 are vertically moved by the ball screw mechanism. Therefore, the gas ejection portion 6 (valve body) connected to the gas introduction pipe 8 can vertically be moved through the lifting/lowering mechanism constituted by the motor 80, the pulley 74, the belt 73, and the ball screw mechanism.

When a film is deposited on the substrate W held on the lower surface of the substrate holding section 5, the motor 80 is driven to lift the gas introduction pipe 8 and the gas ejection portion 6 through the ball screw mechanism, to a predetermined position for film deposition. At that time, the rotor R of the pump 2 is rotated to evacuate the deposition chamber 1. Then, a deposition gas is ejected from the gas ejection portion 6 toward the substrate W to form a film on the surface of the substrate W held on the substrate holding section 5. In this state, the gas ejection portion 6 as the valve body is positioned separately from the suction port 3 to open the suction port 3 of the pump 2. Therefore, the deposition chamber 1 can be evacuated by the turbo-molecular pump 2.

On the other hand, when it becomes necessary to keep the interior of the deposition chamber 1 under vacuum, the motor 80 is driven to lower the gas introduction pipe 8 and the gas ejection portion 6 through the ball screw mechanism, to the lowest position, i.e., to such a position that the suction port 3 is closed by the gas ejection portion 6. FIG. 4 shows the substrate processing apparatus in this state. As shown in FIG. 4, the suction port 3 is closed by the gas ejection portion 6 (valve body) through an O-ring 41 provided on the lower surface of the gas ejection portion 6. Therefore, the interior of the deposition chamber 1 can be kept under vacuum. Alternatively, a seal may be provided at the circumferential portion of the suction port 3 in the flange 52 of the pump 2 to keep the interior of the deposition chamber 1 under vacuum. Further, a seal may be provided on the deposition chamber 1 to keep the interior of the deposition chamber 1 under vacuum.

According to this structure, the pressure in the deposition chamber 1 is efficiently and speedily controlled by adjusting the amount of gas introduced from the gas ejection portion 6. Simultaneously, the pressure in the deposition chamber 1 can also be controlled by adjusting the degree of opening of the gas ejection portion 6 as the valve body. Thus, the pressure in the deposition chamber 1 can efficiently and speedily be controlled, compared with a conventional substrate processing apparatus. Specifically, a gas can ideally be introduced into the deposition chamber 1, and hence the gas ejection portion 6 as the valve body can control the pressure in the deposition chamber 1 and keep the interior of the deposition chamber 1 under vacuum.

As described above, according to the present invention, a positional relationship between a substrate to be processed and a gas ejection portion can be optimized from the viewpoint of introduction of gas and evacuation of gas, and it is possible to downsize the apparatus.

Further, both of evacuation of a gas from the surface of the substrate and ejection of a gas onto the surface of the substrate can directly be performed, so that the pressure around the surface of the substrate can speedily be adjusted. Therefore, the productivity and quality of processing the substrate can be improved. Specifically, evacuation of a gas and ejection of a gas can speedily be performed.

When the gas ejection portion in the vacuum pump is provided on a suction side of the vacuum pump, the gas ejection portion can relatively simply be provided without consideration of the complicate structure of the interior of the pump. Further, the gas ejection portion can be provided so as not to lower the exhaust capacity of the vacuum pump.

When the gas introduction path for introducing the gas into the gas ejection portion is formed so as to be passed through at least a portion of a rotor in the vacuum pump, it is easy to select a portion at which a gas inlet port connected to the gas introduction path is provided. Therefore, it is possible to downsize the whole apparatus. Further, since the gas introduction path can linearly be provided, problems caused by the gas introduction path, for example, resistance and deterioration in the control responsiveness due to a bend of the gas introduction path or the like can be prevented.

When the gas ejection portion in the vacuum pump comprises a valve body for closing and opening a suction port provided on a chamber side of the vacuum pump, the vacuum pump can also serve as a valve, so that it is possible to downsize the whole apparatus. Further, the pressure in the chamber can be controlled with higher accuracy, for thereby improving processing rate and quality of processing the substrate.

Although certain preferred embodiments of the present invention have been shown and described in detail, it should be understood that various changes and modifications may be made therein without departing from the scope of the appended claims.

What is claimed is:

1. A substrate processing apparatus for processing a substrate introduced into a chamber under a low pressure, said substrate processing apparatus comprising:
a vacuum pump for evacuating said chamber, said vacuum pump being disposed in the vicinity of said chamber; and a gas ejection portion provided in said vacuum pump for ejecting a gas toward said substrate.

2. A substrate processing apparatus according to claim 1, wherein said gas ejection portion in said vacuum pump is provided on a suction side of said vacuum pump.

3. A substrate processing apparatus according to claim 1, further comprising a gas introduction path passed through at least a portion of a rotor in said vacuum pump for introducing said gas into said gas ejection portion.

4. A substrate processing apparatus for processing a substrate introduced into a chamber under a low pressure, said substrate processing apparatus comprising:

a vacuum pump for evacuating said chamber, said vacuum pump being disposed in the vicinity of said chamber; and a gas ejection portion adjacent said vacuum pump comprising a valve body for closing and opening a suction port provided on a chamber side of said vacuum pump, wherein said vacuum pump has a moving mechanism for vertically moving said valve body.

5. A substrate processing apparatus for processing a substrate introduced into a chamber under a low pressure, said substrate processing apparatus comprising:

a vacuum pump for evacuating said chamber, said vacuum pump being disposed inside of said chamber; and a gas ejection portion provided in said vacuum pump for ejecting a gas toward said substrate.

6. A substrate processing apparatus according to claim 5, wherein said gas ejection portion in said vacuum pump is provided on a suction side of said vacuum pump.

7. A substrate processing apparatus according to claim 5, further comprising a gas introduction path passed through at least a portion of a rotor in said vacuum pump for introducing said gas into said gas ejection portion.

8. A substrate processing apparatus for processing a substrate introduced into a chamber under a low pressure, said substrate processing apparatus comprising:

a vacuum pump for evacuating said chamber, said vacuum pump being disposed inside of said chamber; and a gas ejection portion adjacent said vacuum pump comprising a valve body for closing and opening a suction port provided on a chamber side of said vacuum pump, wherein said vacuum pump has a moving mechanism for vertically moving said valve body.

* * * * *